United States Patent [19]

Monk

[11] Patent Number: 5,321,651

[45] Date of Patent: Jun. 14, 1994

[54] READ AND WRITE CIRCUITRY FOR A MEMORY

[75] Inventor: Trevor K. Monk, Bexley, England

[73] Assignee: Inmos Limited, Bristol, United Kingdom

[21] Appl. No.: 911,888

[22] Filed: Jul. 10, 1992

[30] Foreign Application Priority Data

Jul. 30, 1991 [GB] United Kingdom ................ 9116493

[51] Int. Cl.$^5$ ................................................ G11C 7/00
[52] U.S. Cl. ............................ 365/189.01; 365/189.02;
365/189.07; 365/189.08; 365/230.02; 365/49
[58] Field of Search ....................... 365/189.01, 189.02,
365/189.07, 230.02, 189.05, 201, 49

[56] References Cited

U.S. PATENT DOCUMENTS

| | | | |
|---|---|---|---|
| 4,670,858 | 6/1987 | Almy | 365/49 |
| 4,882,709 | 11/1989 | Wyland | 365/189.02 |
| 5,148,396 | 9/1992 | Nakada | 365/189.03 |
| 5,239,642 | 8/1993 | Gutierrez et al. | 395/425 |

Primary Examiner—Eugene R. LaRoche
Assistant Examiner—Andrew Tran
Attorney, Agent, or Firm—Edward D. Manzo

[57] ABSTRACT

A memory is provided with at least one temporary store and write abort circuitry having a control signal store and gating circuitry responsive to an output from the control signal store. Write circuitry loads data and an associated address in the temporary store during one write cycle and transfer circuitry transfers the data to the associated address during a subsequent write cycle when the write operation is not to be aborted. Read circuitry includes a comparator for comparing a read address with an address in the temporary store and transfer circuitry includes selection circuitry to select an output of data either from the temporary store or the memory dependent on the output of the comparator circuitry, an output from the temporary store being prevented if the control signal store indicates that the write operation is to be aborted.

10 Claims, 3 Drawing Sheets

READ AND WRITE CIRCUITRY FOR A MEMORY

The invention relates to memories having a plurality of addressable locations for holding data in which data is written to selected locations during respective write cycles and data is read from selected locations during respective read cycles. The invention is particularly concerned with the construction and operation of such a memory which permits a write abort signal to be generated during a write cycle to indicate that data input during the write cycle is not to be written into the address memory location.

The invention is particularly applicable to computer memories such as SRAMS, DRAMS and EPROMS and is particularly applicable to the provision of an abort signal late in a write cycle.

BACKGROUND OF THE INVENTION

Memory systems of the type referred to above input data during a write cycle and usually memory cell contents are updated as soon as possible after data is input during a write cycle. In some cases it is desirable to abort the write operation before the data stored in the memory is changed but the time during which a write cycle can be safely aborted is usually very short.

The present invention provides an improved memory design and memory operation in which write cycles may be safely aborted. In a preferred embodiment a write abort signal may be provided at any time up to the start of a next memory read or write cycle.

It is a further object of the present invention to provide a improved memory design which operates with conventional read and write cycle timing but includes additional circuitry to allow write abort operations.

The invention is particularly applicable to memory designs as described in our copending U.K. Patent Application No. 9116480.6. The disclosure in that copending application is incorporated herein by cross reference.

SUMMARY OF THE INVENTION

The present invention provides a method of writing data to and reading data from a memory having a plurality of addressable storage locations, which method comprises determining read cycles during each of which data may be read from a selected location in the memory and write cycles during which data may be written to a selected location in the memory, each write cycle including providing an abort control signal to indicate if data input during that write cycle is to be written into the memory or the write operation aborted. The method further comprises during one write cycle loading data and an associated memory location address for that data in a temporary store, during a subsequent write cycle testing said abort control signal and transferring said data to the memory location indicated by said associated address if the abort control signal indicates that the write operation is not to be aborted, and during a read cycle inputting a read address, comparing said read address with the address in the temporary store and outputting data from said memory if the read address is not located in the temporary store and outputting data from the temporary store if the read address is located in the temporary store and the abort control signal indicates that the write operation is not to be aborted.

The present invention also provides according to its preferred embodiment a memory having a plurality of addressable locations, read and write circuitry coupled to said memory and including at least one temporary store for holding data and an associated memory address, and write abort circuitry having a control signal store and gating circuitry responsive to an output from the control signal store. The write circuitry has an input to determine respective write cycles and is coupled to said temporary store to load data and an associated address into the temporary store during one write cycle. Transfer circuitry is coupled to said write circuitry, to said memory, and to said temporary store to transfer data from the temporary store to the memory at an address indicated by said associated memory address during a subsequent write cycle when said control signal store provides an output to the gating circuitry indicating that the write operation is not to be aborted. The read circuitry has an input for a read address and comparator circuitry for comparing said read address with an address in the temporary store. The transfer circuitry includes selection circuitry to select an output of data from either the temporary store or said memory dependent on an output of said comparator circuitry. The selection circuitry is coupled to said gating circuitry to prevent an output from said temporary store if said control signal store provides an output to the gating circuitry indicating that the write operation is to be aborted.

In a preferred embodiment data is output from the memory if the read address is located in the temporary store and the stored abort control signal indicates that the write operation is to be aborted.

DESCRIPTION OF THE PREFERRED EMBODIMENTS

Figure 1:
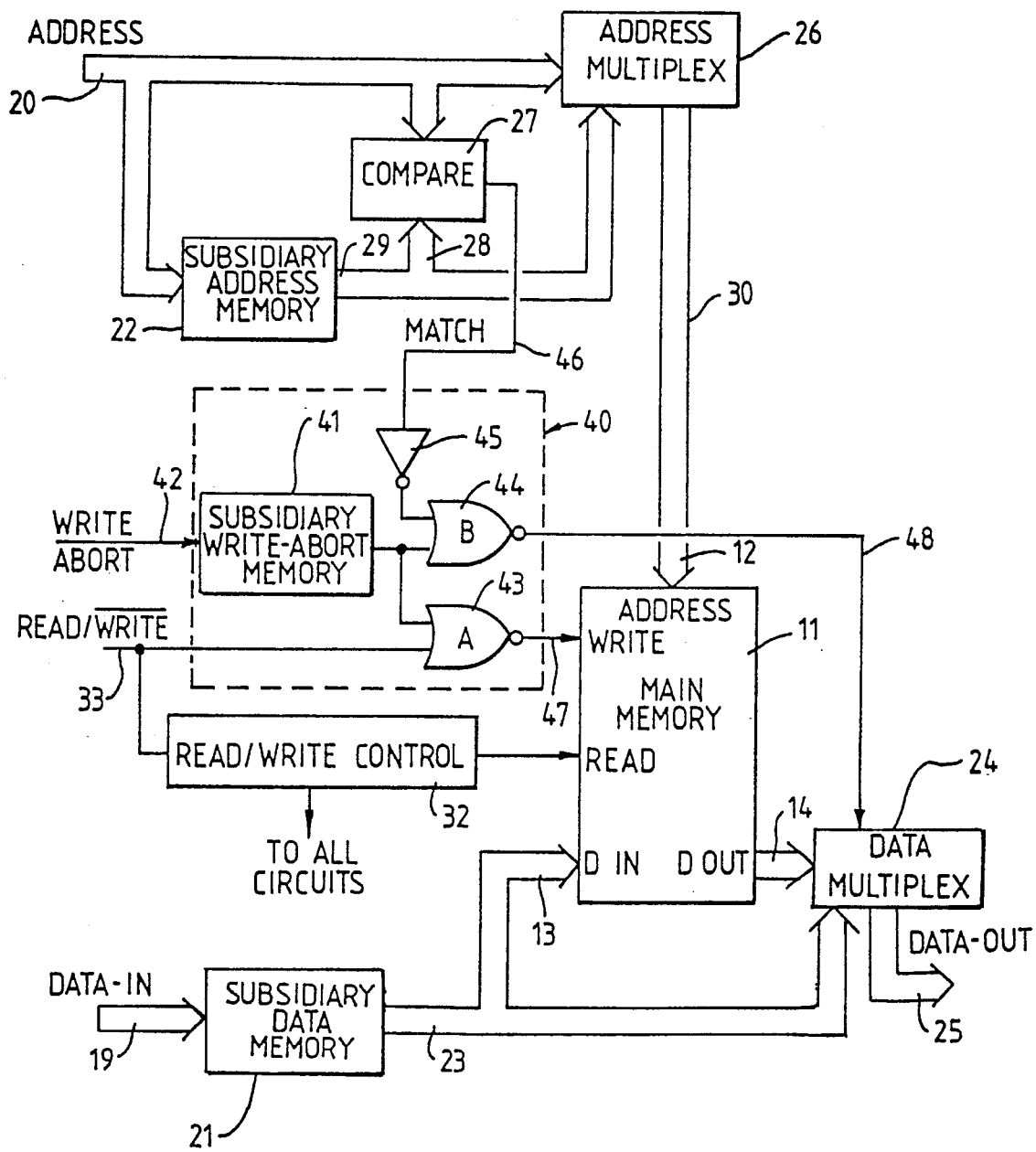
FIG. 1 shows a block diagram of one embodiment of the present invention.

The example shown in FIG. 1 is generally similar to that described in our copending Application No. 9116480.6. Similar parts have been marked with similar reference numerals. A main memory 11 is an asynchronous SRAM of conventional design having a plurality of addressable memory cells which can be addressed by use of row and column decoders and data written to selected memory locations by use of driver circuits. The main memory 11 has an input 12 for indicating the address of the selected memory location and a further input 13 for data which is to be written into the main memory. An output 14 is provided for data which is read from the main memory. The memory circuitry includes read and write circuitry which permits late presentation of data and an associated address during a write cycle. This read and write circuitry includes a first input 19 for data which is to be written into the memory and a second input 20 for an associated address for each data input to indicate the memory address in which the data is to be stored. In addition, the temporary store comprises a data memory 21 and an address memory 22. These may each be provided by one or more registers. The data input 19 is connected to the data memory 21 which has an output 23 connected to the main memory input 13 and to a data multiplexor 24 connected to the output 14 of the main memory. The data multiplexor 24 has a final output 25 for outputting data which is read from the memories 21 or 11.

The address input 20 is connected to the temporary memory 22 and to an address multiplexor 26. The address input 20 is also connected to a comparator unit 27 arranged to receive as an input 28 an output 29 from the temporary address memory 22. The output 29 from the memory 22 is also connected to the address multiplexor 26. The address multiplexor 26 provides an output 30 which is connected to the address input 12 of the main memory 11. The read and write circuitry includes control logic 32 having an input 33 in the form of a read/-write. This input 33 is in this example arranged to be driven high when a reading operation is required and low when a write operation is required. The control logic 32 is coupled to each of the memories 11, 21, 22 as well as to the comparator unit 27 and address multiplexor 26 and data multiplexor 24.

The control logic 32 is also connected to write abort circuitry 40 which is shown in the area marked with broken lines in FIG. 1 and enables a write abort operation to be effective. In this case, the write abort circuitry comprises an abort control signal store 41 which may consist of a simple register connected to an input 42 to receive an abort control signal which in this example will have a signal "0" if the write operation is to be effected or a "1" if the write operation is to be aborted. The store 41 is connected to a first NOR gate 43 which also receives input signal 33 as an input. A second NOR gate 44 is connected to the store 41 and through an invertor 45 to the output 46 from the comparator 27. The first NOR gate 43 provides an input 47 to permit or prevent write operations in the memory 11. The second NOR gate 44 provides an output 48 connected to the data multiplexor 24 to control selection by the data multiplexor of data from the temporary store 21.

The operation of this example is as follows:

The timing of each read and write cycle is controlled by the signal at input 33. During one write cycle data is loaded into the temporary store 21 with an associated memory address loaded into the temporary store 22. At the end of each write cycle the status of the input signal 42 indicates whether or not the signals which have been input on lines 19 and 20 are to be used in changing the stored data in the main memory 11. If the data is to be written into the memory then line 42 has a signal value "0" to indicate that a write operation is to be effected but if the write operation is to be aborted then the signal 42 has a signal level "1". The value of this signal at the end of each write cycle is stored in the store 41 and continues to be output from this store until it is overwritten at the end of the next write cycle. For a write cycle which is not to be aborted, the value "0" stored in store 41 is input to the NOR gates 43 and 44 and during a next write operation the second input to NOR gate 43 from input 33 will be "0" and consequently the output of the NOR gate 43 will have value "1" forming an input 47 allowing a write operation to be effected in the memory 11. This will allow data which was put into the temporary store 21 during the previous write cycle to be written into the main memory at an address indicated by the address held in the temporary store 22 from the previous write cycle.

If however the write abort signal had been given at the end of the write cycle when data was loaded into the temporary store 21 and an address into the temporary store 22, then the signal value "1" will have been held in the control signal store 41 and the value "1" input to both the NOR gates 43 and 44. Consequently during the next write cycle although the NOR gate 43 will receive a signal value "0" from input 33, it will receive a signal "1" from the store 41, and this will cause a "0" value to be output from the NOR gate 43. Consequently a "0" input will be provided at 47 to the main memory preventing any writing into the main memory of data which was held in the temporary memory 21.

It will be appreciated that the temporary memories 21 and 22 are simple, fast, operating memories which do not require addressing in order to load data into them. In this way they may be used as described in our copending UK Application No. 9116480.6 and U.S. Ser. No. 07/911,514 filed herewith to allow late writing of data into stores 21 and 22 during any write cycle without loss of that data. The data is then normally transferred into the main memory during a subsequent write cycle unless the write abort signal was generated.

The invertor 45 and NOR gate 44 are required for read cycles. There are two cases in which it is necessary to consider read cycles. In the first case a read cycle is performed on an address which does not match the address of the previously stored write cycle. In other words, the address which is input at input 21 during a read cycle is compared by the comparator 27 with the address held in store 22 from the last write cycle and does not correspond. In this case the comparator provides an output value "0" on line 46 which is inverted by invertor 45 to provide a signal "1" at an input to NOR gate 44. This means that the NOR gate provides an output "0" on line 48 thereby controlling the data multiplexor 24 to cause data to be output on output 14 from the main memory 11 at the address indicated by input 12 which derives the address through the address multiplexor 26 from the input 20. In this case the read operation derives data from the main memory 11 and is independent of the status of the write abort signal which is held in the control signal store 41.

In a second case a read cycle is performed on an address input at 20 which the comparator 27 indicates as corresponding to the address held in the temporary memory 22. In this case the output 46 of the comparator has a signal value "1" which is inverted by invertor 45 to provide a "0" input to the NOR gate 44. If the previous write cycle was not to be aborted then the signal stored in the control signal store 41 will be a "0" and consequently the NOR gate 44 provides an output "1" which is supplied on line 48 to the data multiplexor 24. This causes the data multiplexor 24 to output through 25 data which was stored in the temporary data store 21 and not from the main memory 11.

If however the previous write cycle included a write abort signal, the control signal store 41 provides a signal "1" to the NOR gate 44. This causes the NOR gate 44 to provide an output "0" to the data multiplexor 24 and so the data multiplexor 24 prevents data being output from the temporary store 21 and only permits output of data from the main memory 11 through output 14 at the address indicated by the input 12. In this way the data which was input at 19 during the write cycle which is to be aborted is not used as an effective output and the data which was previously held in the main memory location at that address is not overwritten and the old data is used.

Although the example of FIG. 1 is applied to an SRAM it may be applied to asynchronous or a synchronous memories including DRAMS and EPROMS.

A further example will now be described with reference to FIGS. 2, 3 and 4 using bit masking operations in an SRAM. Similar reference numerals have been used for similar components and in FIG. 4 the write abort circuitry has again been shown in broken lines marked 40.

Figure 2:
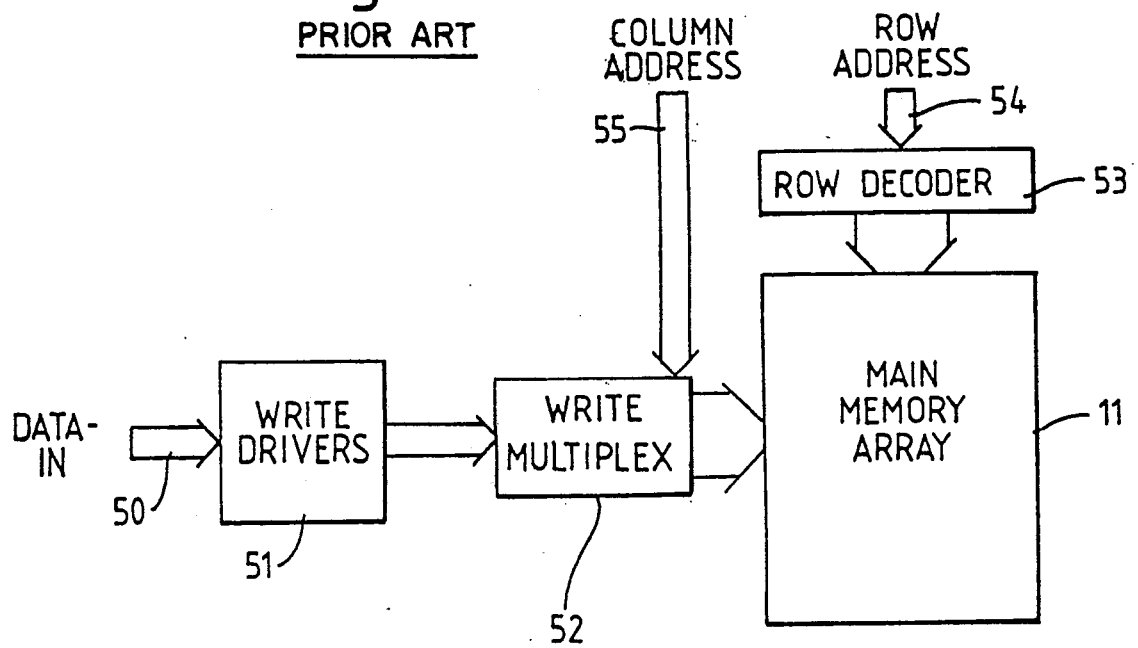
FIG. 2 shows a block diagram of a conventional SRAM.

The write operation in a conventional SRAM is shown in FIG. 2. Input data 50 passes through write drivers 51 and is fed to appropriate bit lines in the memory 11 by a write multiplexor 52. A row decoder 53 turns on access transistors of memory cells in selected rows of the memory 11 dependent on a row address given on input 54. The multiplex circuit 52 determines selected columns by a column address input at 55. In a conventional n-channel array writing is achieved by pulling one bit line in each selected pair of bit lines to a low level. If both bits lines in a pair are held high during a write cycle, the memory cell contents are unchanged.

Figure 3:
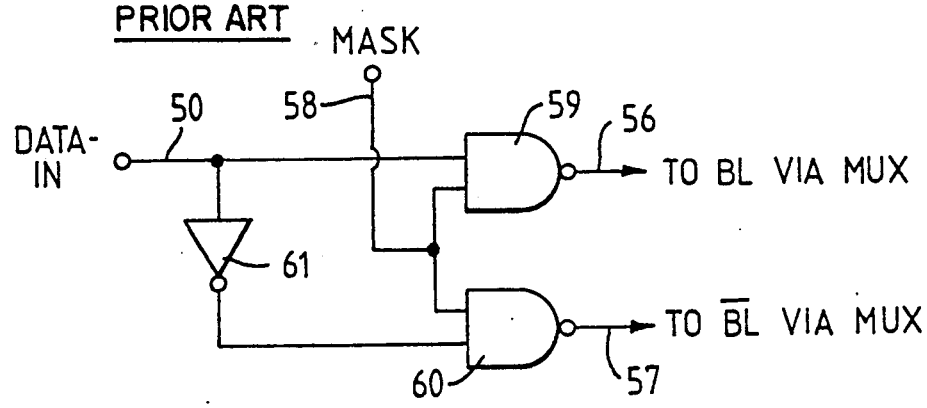
FIG. 3 shows a known circuit for masking input signals to an SRAM of the type shown in FIG. 2.
Figure 4:
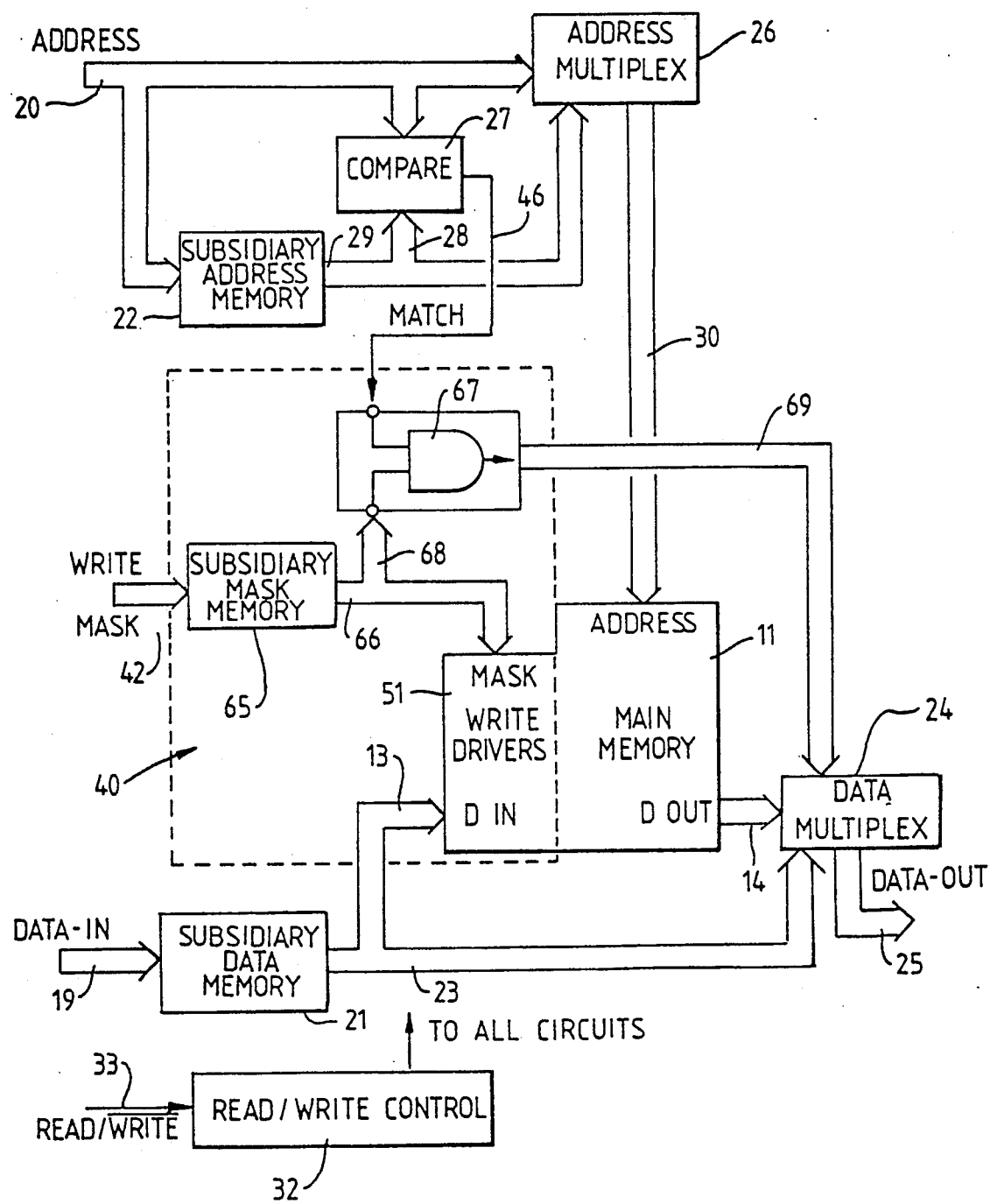
FIG. 4 is a block diagram of a further embodiment of the present invention applied to an SRAM with a masking circuit of the type shown in FIGS. 2 and 3.

FIG. 3 shows how the driver circuit 51 may be modified to provide a masked write operation. FIG. 3 shows one input 50 controlling outputs 56 and 57 for a pair of bit lines. A mask input 58 is provided forming an input to each of two NAND gates 59 and 60. NAND gate 59 has as its other input the signal 50. NAND gate 60 has as its second input the data in signal 50 after passing through an invertor 61. If it is required to mask a pair of bit lines so as not to alter the contents of memory cells connected to that bit line then an input "0" will be provided at the mask input 58. This will cause both outputs 56 and 57 from the NAND gates to have the value "1" thereby preventing change in the memory cell contents connected to those bit lines. If the mask input 58 has the value 1, a data in signal on line 50 will cause one of the NAND gates 59 or 60 to provide a low output "0" on either of the lines 56 or 57 depending on the data in signal at 50, and this will cause a write operation to be effected in the memory.

The write masking operation described with reference to FIGS. 2 and 3 is applied to the embodiment of the present invention shown in FIG. 4. In this example a write mask input 42 comprises a plurality of mask input signals corresponding to signal 58 in FIG. 3. The input 42 includes a write mask input for every bit of the data input so that masking may be performed on a bit-by-bit basis. The input 42 is stored in a temporary memory 65 which provides an output on line 66 to the write drivers 51. The output of the comparator 27 is provided on line 46 to one input of an AND gate 67. The other input of the AND gate is derived from line 68 connected to the output of the mask memory 65. It will be appreciated that a plurality of AND gates 67 are provided, one for each bit. Similarly the output 46 from the comparator 27 provides a plurality of signals for respective bits supplied to respective AND gates 67. If a write mask bit has the value "1" then a respective data bit will be written. If the write mask bit is "0" then the respective data bit will not overwrite the existing main memory contents. If all the write mask bits are "0" then none of the main memory contents will be overwritten and the write cycle is effectively aborted. The mask memory 65 may be a simple register.

Operation of this example is as follows

The timing of read and write cycles are controlled by the input signal 33 to the control 32. During each write cycle data is loaded into the temporary store 21 and the associated memory address is loaded into the temporary store 22. At the end of a write cycle the mask write inputs on bus 42 are stored in the mask memory 65. This information is output on bus 66 until it is overwritten at the end of the next write cycle. The signals on bus 66 are used to control write driver activity during the write cycles and by the output of the AND gate 67 to output correct data during read cycles. At the start of a write cycle, previously stored input data in memory 21 is presented on bus 13 to the write drivers 51. Drivers which have a "1" signal presented to their mask input on bus 66 write data to the main memory array by pulling one bit line low. Write drivers which have a "0" in their mask input 66 hold both bit lines high throughout the write operation so that the contents of the memory cells remain unchanged.

Data which is input during one write cycle to the temporary memories 21 and 22 does not reach the main memory 11 until the next write cycle and consequently read cycles must use circuitry to read out data from either the temporary store 21 or the main memory 11. There are two different read cycles which need to be considered. In the first case a read cycle is performed on an address which does not match the address of the previously stored write cycle. The comparator 27 compares the input address 20 with that stored in the temporary store 22 and if no correspondence is found all outputs on line 46 are "0". In this way all the AND gates 67 also output "0"s on bus 69 so that the multiplexor 24 selects output data from the main memory 11 on bus 14 rather than data from the temporary memory 21 on bus 23. If the read cycle is performed on an address which does match that already held in the temporary store 22, the comparator 27 outputs signal values "1" on line 46 to each of the AND gates 67 and this allows the mask memory output on buses 66 and 68 to be fed along bus 69 to the data multiplexor 24. If the mask bit from the stored 65 has a "0" value this ensures that the respective data bit which is output on 25 is derived from the main memory 11 whereas a mask bit of value "1" switches the data multiplexor 24 so that the output 25 is derived from data held in the temporary memory 21.

The invention is not limited to the details of the foregoing examples. For instance, in the example of FIG. 4 the masking operation may be performed by selectively disconnecting the bit lines from the write drivers. The write mask information which is held in the store 65 may be accepted at any time before the start of the next memory cycle and need not necessarily be determined at the end of every write cycle. The operating principles of these examples can be applied to synchronous memories or asynchronous memories and may use other forms of logic. The invention is applicable to memories without an n-channel array by providing appropriate write drivers. Although in the example of FIG. 4 the write mask operation is on a bit-by-bit basis, the invention may be implemented in a way which masks groups of bits at a time. For instance a 16 bit word may be masked as two groups of 8 bits. In the limit, a single write mask input could control masking of all data bits in which case the input could be called write abort.

I claim:

1. A method of writing data to and reading data from a memory having a plurality of addressable storage locations, which method comprises determining read cycles during each of which data may be read from a selected location in the memory and write cycles during which data may be written to a selected location in the memory, each write cycle including providing an abort control signal to indicate if data input during that write cycle is to be written into the memory or the write operation aborted, said method further comprising during a first write cycle, loading data, an abort control signal, and an associated memory location address for that data in temporary storage circuitry, during a second write cycle, later than said first write cycle, testing said abort control signal and transferring said data to the memory location indicated by said associated address if the abort control signal indicates that the write operation is not to be aborted, and during a read cycle inputting a read address, comparing said read address with the address in the temporary storage circuitry and outputting data from said memory if the read address is not located in the temporary storage circuitry and outputting data from the temporary storage circuitry if the read address is located in the temporary storage circuitry and the abort control signal indicates that the write operation is not to be aborted.

2. A method according to claim 1 further comprising storing said abort control signal generated in one write cycle for use in a next write cycle, and writing new data into said temporary storage circuitry during said next write cycle.

3. A method according to claim 2 including preventing transfer of data from said temporary storage circuitry to the memory during said next write cycle if the stored abort control signal indicates that the write operation of said one write cycle is to be aborted.

4. A method according to claim 2 in which during a read cycle data is output from the memory if the read address is located in the temporary storage circuitry and the stored abort control signal indicates that the write operation is to be aborted.

5. A method according to claim 1 in which control of writing from the temporary storage circuitry to the memory and reading of data selectively from the temporary storage circuitry or memory is controlled by a plurality of gating circuits representing respective bits of words to be written or read.

6. A method according to claim 1 in which control of writing from the temporary store to the memory and reading of data selectively from the temporary storage circuitry or memory is controlled by gating circuitry which generates one write control signal and one read selection signal each controlling a plurality of bits of each word to be written or read.

7. A memory having a plurality of addressable locations, read and write circuitry coupled to said memory and including at least one temporary store for holding data and an associated memory address, and write abort circuitry having a control signal store for a write control signal and gating circuitry responsive to an output from the control signal store, said write circuitry having an input to determine respective write cycles and being coupled to said temporary store to load data and an associated address into the temporary store and a write control signal into said control signal store during a first write cycle, and transfer circuitry coupled to said write circuitry to said memory and to said temporary store to transfer data from the temporary store to the memory at an address indicated by said associated memory address during a second write cycle later than said first write cycle when said control signal store provides an output to the gating circuitry indicating that the write operation is not to be aborted, said read circuitry having an input for a read address and comparator circuitry for comparing said read address with an address in the temporary store, the transfer circuitry including selection circuitry to select an output of data from either the temporary store or said memory dependent on an output of said comparator circuitry, said selection circuitry being coupled to said gating circuitry to prevent an output from said temporary store if said control signal store provides an output to the gating circuitry indicating that the write operation is to be aborted.

8. Apparatus according to claim 2 in which said gating circuitry is arranged to provide a write control signal and a read selection signal for operation of said transfer circuitry, thereby controlling writing of data from the temporary store to the memory and the selective reading of data from the temporary store or memory.

9. Apparatus according to claim 8 in which said gating circuitry is arranged to provide one write control signal and one read selection signal each controlling a plurality of bits of each word to be written or read.

10. Apparatus according to claim 8 in which said gating circuitry comprises a plurality of gating circuits representing respective bits of words to be written or read.

* * * * *